United States Patent
Swaminathan

(10) Patent No.: US 9,376,762 B2
(45) Date of Patent: Jun. 28, 2016

(54) WEIR FOR IMPROVED CRYSTAL GROWTH IN A CONTINUOUS CZOCHRALSKI PROCESS

(71) Applicant: Solaicx, Inc., Santa Clara, CA (US)

(72) Inventor: Tirumani N. Swaminathan, Creve Coeur, MO (US)

(73) Assignee: Solaicx, Maryland Heights, MO (US)

( * ) Notice: Subject to any disclaimer, the term of this patent is extended or adjusted under 35 U.S.C. 154(b) by 508 days.

(21) Appl. No.: 13/689,189

(22) Filed: Nov. 29, 2012

(65) Prior Publication Data

US 2014/0144372 A1  May 29, 2014

(51) Int. Cl.
*C30B 15/12* (2006.01)
*C30B 15/00* (2006.01)
*C30B 29/06* (2006.01)

(52) U.S. Cl.
CPC ............ *C30B 15/12* (2013.01); *C30B 15/002* (2013.01); *C30B 29/06* (2013.01); *Y10T 117/1052* (2015.01)

(58) Field of Classification Search
CPC ........ C30B 15/00; C30B 15/02; C30B 15/10; C30B 15/12; Y10T 117/00; Y10T 117/10; Y10T 117/1024; Y10T 117/1032; Y10T 117/1052; Y10T 117/1056; Y10T 117/1068
USPC ............. 117/11, 13, 30–31, 33–34, 200, 206, 117/208, 213–214, 217, 928, 931, 932
See application file for complete search history.

(56) References Cited

U.S. PATENT DOCUMENTS

| | | | |
|---|---|---|---|
| 5,720,810 A | * | 2/1998 | Arai ................... C30B 15/12 117/208 |
| 8,262,797 B1 | * | 9/2012 | Bender .............. C30B 29/06 117/217 |
| 2008/0134958 A1 | | 6/2008 | Bender | |

FOREIGN PATENT DOCUMENTS

| | | |
|---|---|---|
| DE | 2245250 A1 | 2/1974 |
| JP | 03183688 A * | 8/1991 |
| JP | H03183688 A | 8/1991 |

OTHER PUBLICATIONS

International Search Report and Written Opinion of the International Searching Authority regarding PCT/US2013/071879 mailed on Feb. 6, 2014, pp. 11.

* cited by examiner

*Primary Examiner* — Kenneth A Bratland, Jr.
(74) *Attorney, Agent, or Firm* — Armstrong Teasdale LLP

(57) ABSTRACT

An apparatus for growing ingots by the Czochralski method includes a growth chamber defining an enclosure configured to circulate a purge gas about the growing ingot and a crucible provided in the growth chamber configured to hold the molten silicon. A weir is supported in the crucible and is configured to separate the molten silicon into an inner growth region surrounding the melt/crystal interface from an outer region configured to receive the crystalline feedstock. The weir comprises at least one sidewall extending vertically and a cap extending substantially perpendicularly to the sidewall.

20 Claims, 5 Drawing Sheets

WEIR FOR IMPROVED CRYSTAL GROWTH IN A CONTINUOUS CZOCHRALSKI PROCESS

FIELD

The field of the disclosure relates generally to growing single crystal semiconductor material by the Czochralski process. In particular, the field of the disclosure relates to a continuous Czochralski process employing a cap weir. The cap weir is configured for modifying the flow and pressure of a gas that lowers the rate of erosion of the weir.

BACKGROUND

In a continuous Czochralski (CZ) crystal growth process, the melt is supplemented or recharged as the crystal is growing. This is in contrast with batch recharge wherein the melt is recharged after the melt is depleted by a completion of a crystal growing process. In either case the melt can be supplemented either with solid feedstock or molten feedstock.

In contrast to batch recharge, there are advantages of a continuous Czochralski process for growing crystal silicon ingots. The melt height remains substantially constant and therefore the growth conditions at the melt-crystal interface can be maintained more uniformly for optimal crystal growth. The cycle time may also be reduced because the melt conditions are not suddenly changed by the addition of a large quantity of feedstock.

A conventional weir arrangement in a conventional continuous crystal growth crucible is shown in FIG. 1. In the conventional Czochralski system, a crucible 100 holds a quantity of molten silicon 102 in which a single crystal ingot 104 is grown and pulled in a vertical direction indicated by arrow 105 from a crystal/melt interface 106. A weir 108, typically shaped as a cylinder is positioned on the floor of the crucible 100 and extends vertically above the melt as shown. The weir 108 defines an inner growth region 110 and an outer melt supplementing region 112. Subsurface passageways 114 connect the first or melt supplementing region 112 with the inner growth region 110.

A heat shield 116 is conical in shape and extends downwardly at an angle to create an annular opening disposed about the growing crystal or ingot 104 to permit the growing ingot to radiate its latent heat of solidification and thermal flux from the melt. The top of the heat shield 116 has a first diameter much wider than the diameter forming the annular opening around the ingot 104. The top of the heat shield 116 is supportably held by an insulating lid or insulation pack. The insulating lid is omitted from the drawing for the sake of simplicity. A flow of an inert gas, such as Argon, is typically provided along the length of the growing crystal as indicated at 117.

A feed supply 118 provides a quantity of silicon feedstock to the melt supplement region 112 of the crucible 100. The silicon feedstock may be in the form of solid chunks of silicon feedstock provided directly to melt region 112. In either case, addition of feedstock to the melt region is often accompanied by particles of dust transported by aerostatic forces over the top of weir 108. The dust or unmelted silicon particles contaminate the growth region 110 and can become attached to the growing ingot 104, thereby causing it to lose its single silicon structure.

Although the conventional weir 108 arrangement of FIG. 1 may help to limit transmission of dust and un-melted particles of silicon by means of melt flowing from the melt supplementing region to the crystal growth region, it fails to address the problem of high erosion rates of the weir. As shown in FIG. 5, conventional quartz weir 108 is subjected to silicon monoxide and Argon gas. Argon gas is pumped over the liquid silicon to remove silicon monoxide gases and to reduce the concentration of oxygen incorporated in the grown crystal. The Argon gas and silicon monoxide gas are indicated by streamlines 500. A side effect of the gas flow is that the weir undergoes rapid erosion at the melt-gas contact line 119 due to surface kinetics and eventually is cut-through to the extent that it no longer functions as a sufficient barrier to the solid polysilicon. Such erosion poses a problem because it requires that the weirs be frequently replaced, causing downtime and increased cost for replacement.

While this conventional weir 108 arrangement may be adequate for preventing unmelted silicon from the melt supplementing region to reach the crystal growth region, the arrangement fails to address the problem of rapid erosion of the weir. This rapid erosion may increase the cost of the process and may decrease throughput by causing downtime to replace the weir.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

In one aspect, an apparatus for growing an ingot by the Czochralski method is disclosed. The ingot is grown from a melt/crystal interface in a quantity of molten silicon replenished by crystalline feedstock. The apparatus includes a growth chamber defining an enclosure configured to circulate a purge gas about the growing ingot and a crucible provided in the growth chamber configured to hold the molten silicon. A weir is mounted in the crucible and configured to separate the molten silicon into an inner growth region surrounding the melt/crystal interface from an outer region configured to receive the crystalline feedstock. The weir includes at least one sidewall extending vertically and a cap extending substantially perpendicularly to the sidewall.

In another aspect, a method for continuous Czochralski crystal growing is disclosed. For such method, one or more crystal ingots are pulled in a growth chamber from a melt/crystal interface defined in a crucible containing molten crystalline material that is replenished by feedstock. The method includes separating the molten crystalline material into an inner growth region surrounding the melt/crystal interface and an outer region for receiving the feedstock using a weir. An inert gas is flowed in contact with the weir and the melt such that a partial pressure of a silicon monoxide gas released from the melt is increased at a maximum weir erosion point.

In yet another aspect, a system for growing ingots by the Czochralski method is disclosed. The ingots are drawn from a melt/crystal interface in a quantity of molten silicon replenished by crystalline feedstock. The apparatus includes a growth chamber defining an enclosure configured to circulate a purge gas about the growing ingot and a crucible provided in the growth chamber configured to hold the molten silicon. A feed supply is provided for supplying the crystalline feedstock. A heater heats the crystalline feedstock and the molten silicon. A weir is supported in the crucible and configured to separate the molten silicon into an inner growth region surrounding the melt/crystal interface from an outer region configured to receive the crystalline feedstock. The weir includes at least one sidewall extending vertically and a cap extending substantially perpendicularly to the sidewall.

SUMMARY

DETAILED DESCRIPTION

Figure 2:
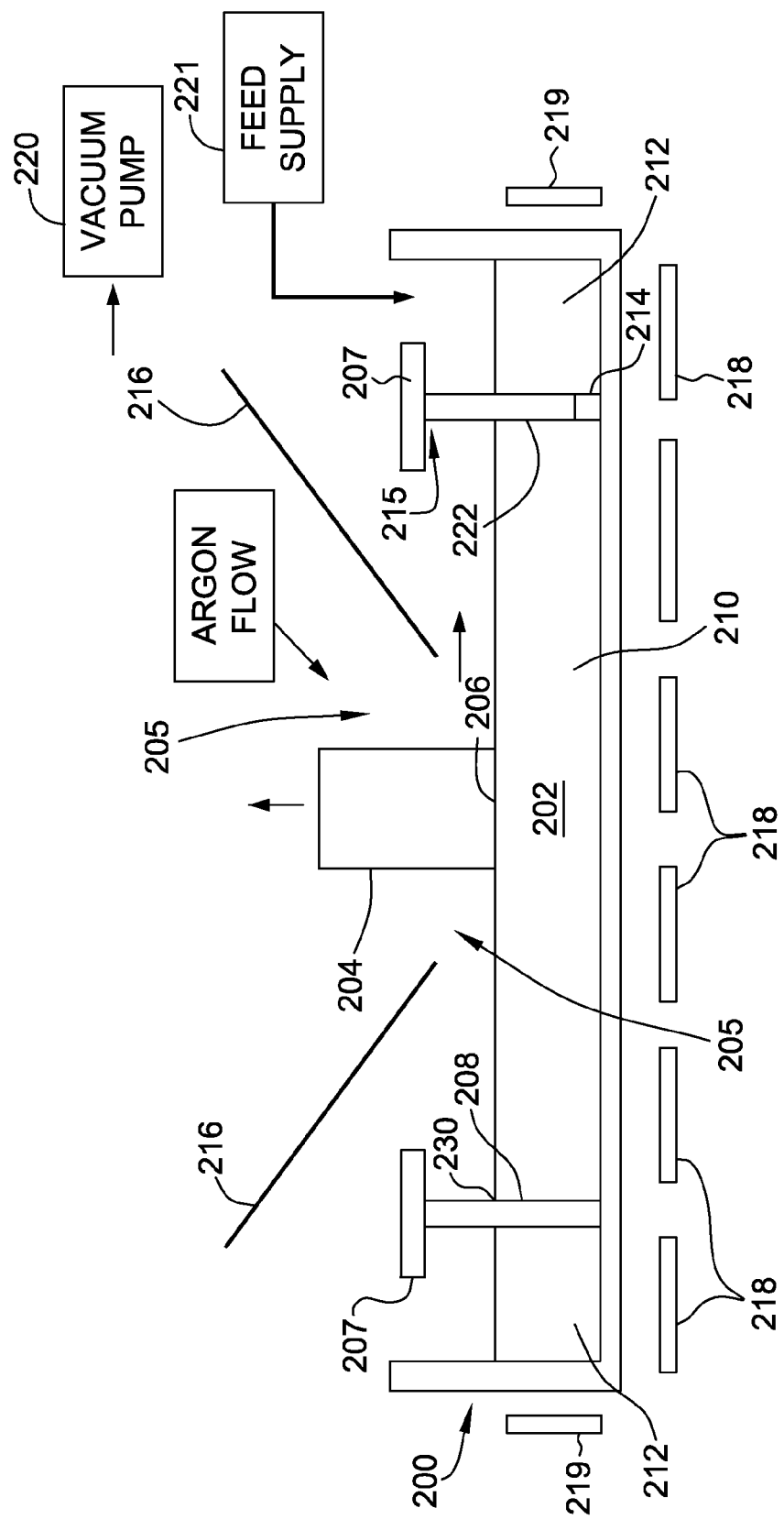
FIG. 2 is a partially schematic view showing a cap weir in a Czochralski crystal growing system according to an embodiment of this disclosure.

Referring to FIG. 2, in accordance with an embodiment of the disclosure, a cap weir 208 is provided in a crucible 200. The cap weir 208 has generally a cylindrical shape with vertically extending sidewalls 222 mounted at the bottom of the crucible 200 that define a growth region in silicon melt 202. The growth region 210 in silicon melt 202 is defined as the region encompassed by sidewalls 222 (i.e., radially inward of the sidewalls). An outer feed supplement region 212 is defined as a region outside of the sidewalls 222 (i.e., radially outward of the sidewalls). As such, the cap weir 208 separates the growth region 210 from a first region or melt supplement region 212 to isolate and prevent thermal and mechanical disturbances from affecting the growing crystal in the growth region 210.

In some embodiments a passageway 214 is defined in sidewalls 222 for controlling melt flow between the melt supplement region 212 and growth region 210. A feed supply 221 supplies a source of solid silicon feedstock to melt supplement region 212. A heat shield 216 may be provided to shield the melt/crystal interface 206 and the ingot 204 from thermal perturbations. In the exemplary embodiment, the heat shield is conical in shape, and angles or tapers radially inwardly in the downward direction, such that the top of the heat shield is much wider than the bottom of the heat shield. The sidewalls of the conical heat shield 216 depend downwardly from the base and at an angle such that a smaller diameter distal end of the heat shield defines a central annular opening 205, large enough to receive the growing ingot, as the single crystal ingot 204 is pulled vertically as shown. In some embodiments, one or more bottom heaters 218 and side heaters 219 are in thermal communication with crucible 200 to supply heat to the melt 202. The bottom heaters may be independently controlled annular heaters 218 disposed in a radial pattern beneath the base of the crucible 200 in addition to side heaters 219, which may provide a more controlled temperature distribution through melt 212.

The cap weir 208 includes a cap 207 extending from an upper portion of the sidewalls 222. In the exemplary embodiment, the cap extends substantially perpendicularly to sidewalls 222, in a radially inward direction and a radially outward direction. In other embodiments, cap 207 may extend in only a radially outward direction from sidewalls 222, or only in a radially inward direction from sidewalls 222.

The cap weir 208 comprises a generally cylindrical shaped body mounted on the base of the crucible 200. The sidewalls 222 of the cap weir 208 extend vertically upward to form and define a modified flow region 215 with the melt 202. It will be appreciated that the modified flow region 215 between the underside of the cap 207 and the melt 202 is optimized to reduce the erosion of the weir by creating gas flow patterns (FIG. 3) in such a way that the partial pressure of gas, such as silicon monoxide gas, is locally increased at the maximum weir erosion point 230.

Figure 3:
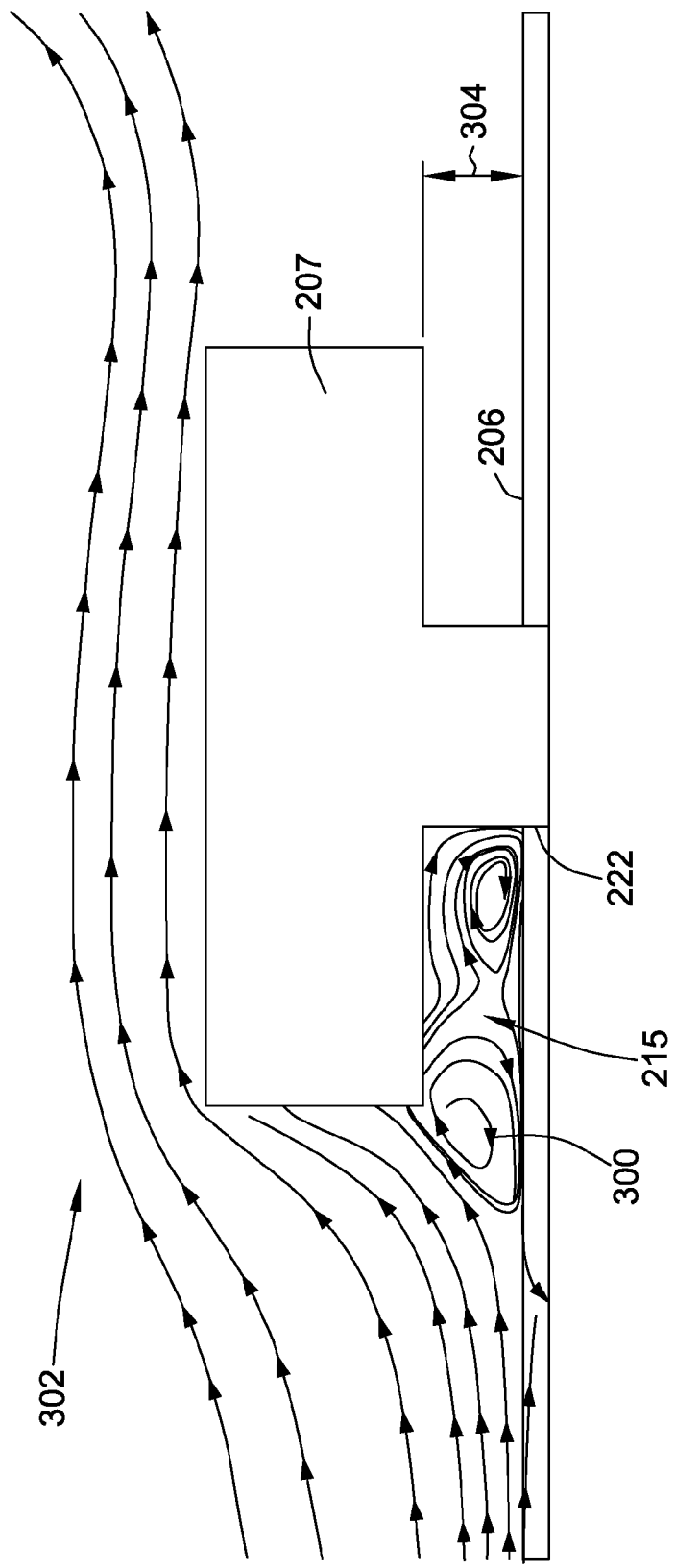
FIG. 3 is an enlarged view of the cap weir showing gas streamlines around the cap weir.

FIG. 3 shows exemplary modified gas streamlines 300 in modified flow region 215, having an interface height 304, in accordance with an embodiment. The dimensions of the cap 207 are chosen such that the extended sides of the cap weir 208 in combination with the adjacent melt 206 provide a modified flow path, represented in FIG. 3 as streamlines 300, for the outflow of the argon purge gas from the ingot. In one embodiment, the outflow of Argon purge gas and/or silicon monoxide gas is supplemented by modifying the pressure within the chamber, for example by using vacuum pump 220 (FIG. 2). That is, the modified flow region 215 is dimensioned, by way of sizing of cap portion 207, to provide a narrowed, focused flow path for the outflow of the purge gas which has the effect of increasing the pressure of the outflow purge gas with respect to flow region 302, which is outside of the modified flow region 215. This local increase in gas pressure advantageously reduces the erosion of the weir at sidewalls 222, thus increasing the usable life of the weir. The diameter of cap weir 208 is selected to as to provide sufficient melt volume in the melt region 212, such that the latent heat of fusion and thermal energy necessary to maintain the silicon at or above its melting temperature is maintained.

Figure 1:
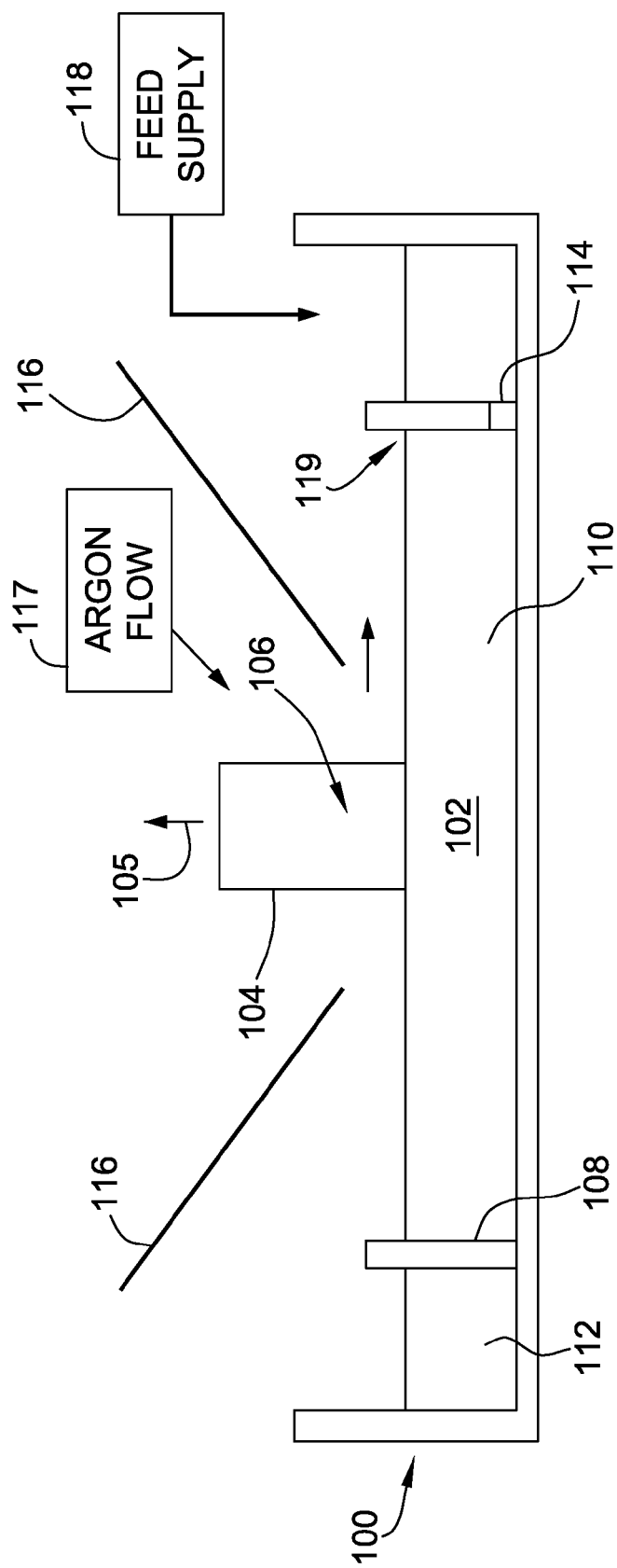
FIG. 1 is a partially schematic view showing a conventional crucible with peripheral heaters in a Czochralski crystal growing system.

Table 1 below shows exemplary performance results of the cap weir in comparison to a Comparative weir, such as the weir of FIG. 1.

TABLE 1

Weir Performance Results

| | Comparative Weir | Exemplary Cap Weir |
|---|---|---|
| Oxygen (ppma) | 11.8 | 11.9 |
| G (K/cm) | 49.5 | 49.5 |
| Heater power (kW) | 67 | 67 |
| Interface height (cm) | 10.1 | 10.1 |
| Feed zone minimum T (K) | 1699 | 1699 |
| Inner erosion rate (mum/hr) | 21.9 | 18.8 |

As shown, in a CZ process with equivalent parameters, the exemplary cap weir provided a reduced inner erosion rate in comparison to a typical non-cap weir. As used herein, the value of G is a measure of the axial temperature gradient in a crystal at the melt-crystal interface. As is known to one of skill in the art, G is a measure of how fast heat may be removed through the crystal and/or how quickly the crystal is cooled. For example, for a given crystal cooling configuration, a lower value of G may indicate that there is additional room for increasing the pull rate of the crystal. For a given configuration, an interface height is a measure of the vertical distance between the melt line and the topmost part of the melt-crystal interface, and may be used as a direct measure of how hot the crystal is. In some instances, a deeper interface may indicate that there is less room for increasing the crystal pull rate, due to a higher crystal temperature.

Figure 4:
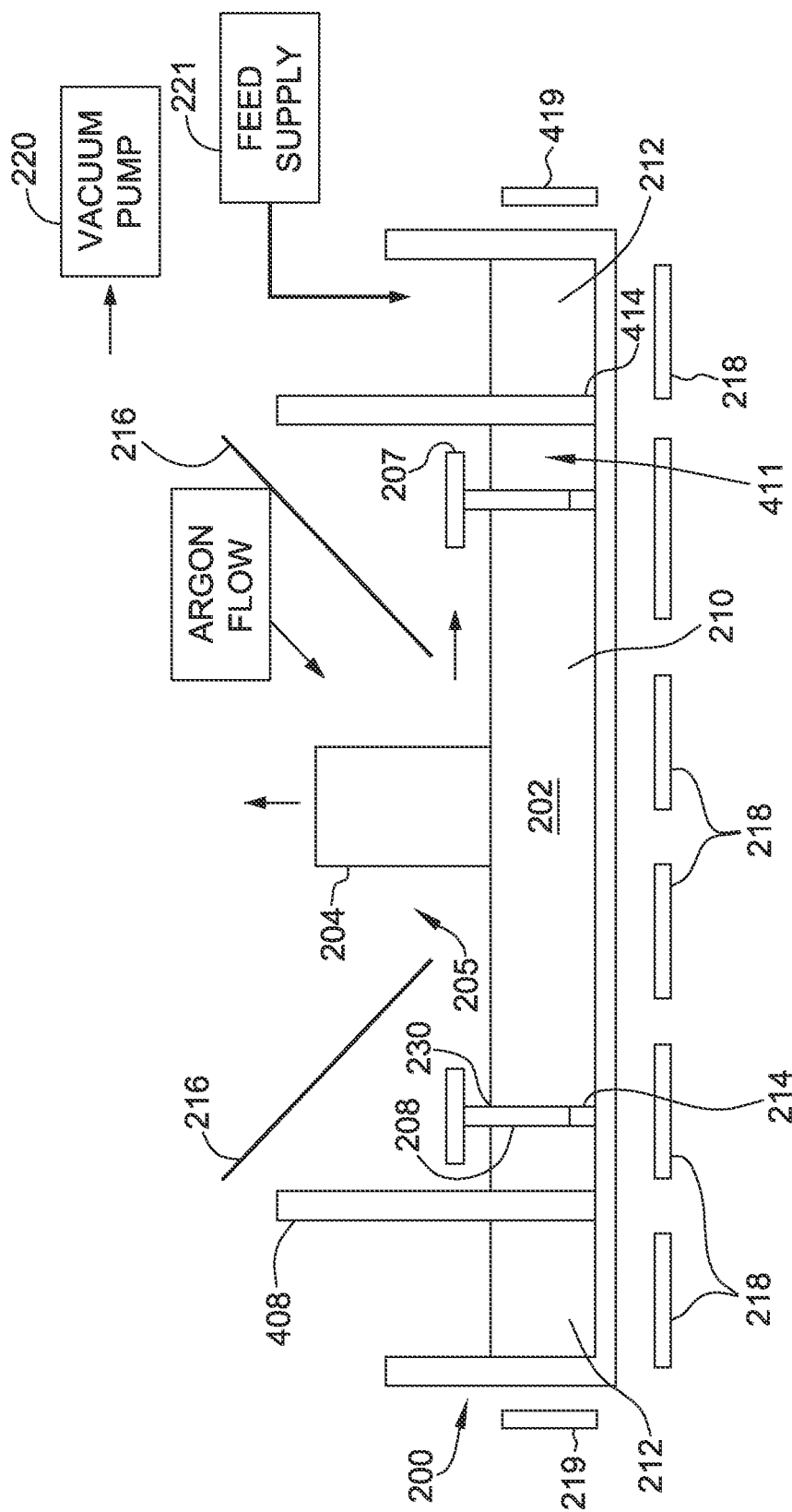
FIG. 4 is a schematic diagram of another cap weir in a Czochralski crystal growing system according to another embodiment.
Figure 5:
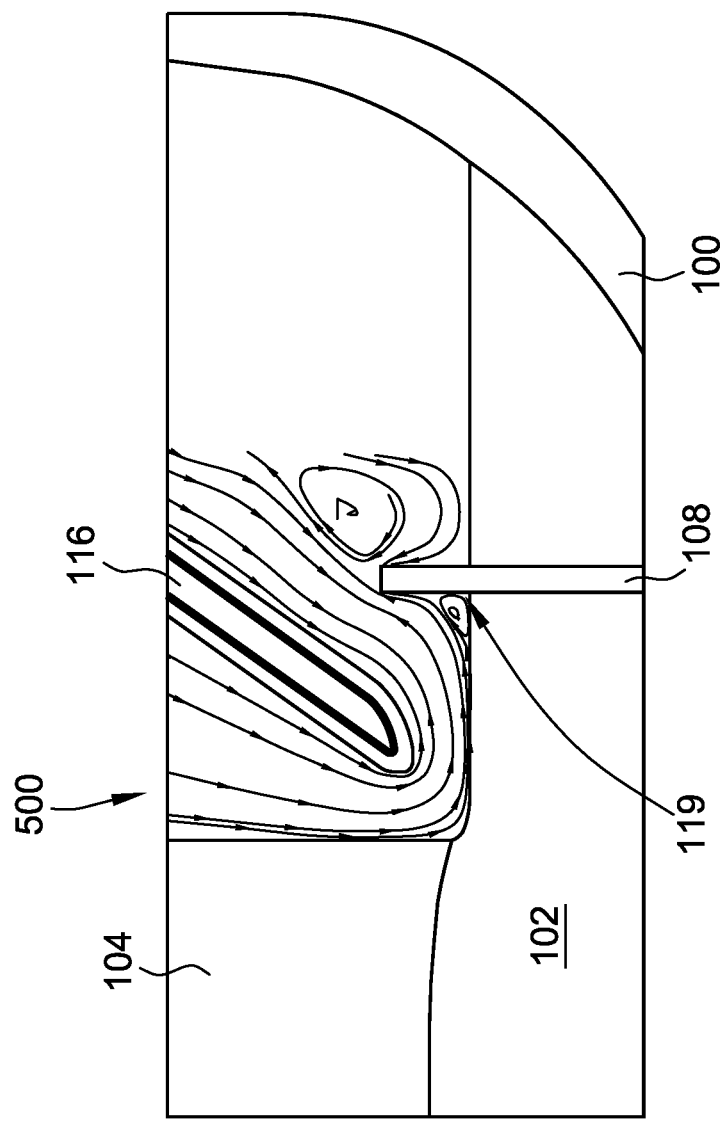
FIG. 5 is an enlarged view of the conventional crucible of FIG. 1 showing gas streamlines.

As shown in FIG. 4, the crucible 200 containing the cap weir 208 may also include a second weir 408 located radially outward from cap weir 208. Although, second weir 408 is shown radially outward from cap weir 208, in other embodiments, second weir 408 may be located radially inward from the cap weir. The second weir defines an interconnecting region 411 between the outer feed supplement region 212 and the growth region 210 of the melt 202.

Feedstock, whether in solid or liquid form, added in at 221 to the feed supplement region 212 of the crucible should be fully melted before it arrives in the central growth region 210, otherwise small particles in the central growth region 210, particularly oxides of unmelted silicon feedstock, can attach themselves to the growing ingot and cause dislocations. Thus, additional time for feedstock to be melted is provided by the feedstock passing through the feed supplement region 212, through passageway 414, and the interconnecting region 411. In addition, the melt in the growth region 210 is devoid of large local temperature fluctuations that can cause dislocations in the growing crystal 204. In this embodiment, the second weir 408 is chosen to be a height that does not substantially interfere with the modified flow path 215. The height of second weir 408 may be the same height, taller or shorter than the cap weir 208, and in some embodiments, the second weir 408 includes a cap portion, similar to cap portion 207. Similarly, the cap weir may be sized with a diameter, such that the second weir does not substantially interfere with the modified flow path 215.

Exemplary embodiments of the apparatus, systems and methods for improved crystal growth in a continuous Czochralski process are described above in detail. The apparatus, systems and methods are not limited to the specific embodiments described herein, but rather, components of the systems and apparatus, and/or steps of the methods may be utilized independently and separately from other components and/or steps described herein. For example, the methods may also be used in combination with other crystal forming systems, methods, and apparatuses, and are not limited to practice with only the systems, methods, and apparatus as described herein. Rather, the exemplary embodiment can be implemented and utilized in connection with many other applications.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. An apparatus for growing an ingot by the Czochralski method, the ingot being grown from a melt/crystal interface in a quantity of molten silicon replenished by crystalline feedstock, the apparatus comprising:
    a growth chamber defining an enclosure configured to circulate a purge gas about the growing ingot;
    a crucible provided in the growth chamber configured to hold the molten silicon;
    a weir mounted in the crucible and configured to separate the molten silicon into an inner growth region surrounding the melt/crystal interface from an outer region configured to receive the crystalline feedstock, the weir having a T-shaped cross-section and including at least one sidewall extending vertically and a cap extending substantially perpendicularly to the sidewall in a direction radially inward from the sidewall, wherein the cap and the sidewall define a modified flow region located radially inward from the sidewall and extending from the molten silicon to a top of the sidewall, wherein the sidewall prevents radial outward gas flow from the modified flow region.

2. The apparatus according to claim 1, wherein the cap extends substantially perpendicular to the sidewall in a direction radially outward from the at least one sidewall.

3. The apparatus according to claim 1, further comprising a second weir mounted in the crucible and having at least one sidewall extending vertically, the second weir located radially outward from the weir.

4. The apparatus according to claim 3, wherein the weir has a lower height than the second weir.

5. The apparatus according to claim 1, further comprising a second weir mounted in the crucible and having at least one sidewall extending vertically, the second weir located radially inward from the weir.

6. The apparatus according to claim 1, wherein the weir is fabricated from quartz.

7. The apparatus according to claim 1, further comprising at least one heater for heating the crucible.

8. A method for continuous Czochralski crystal growing wherein one or more crystal ingots are pulled in a growth chamber from a melt/crystal interface defined in a crucible containing molten crystalline material that is replenished by feedstock, the method comprising:
    separating the molten crystalline material into an inner growth region surrounding the melt/crystal interface and an outer region for receiving the feedstock using a weir having a T-shaped cross-section;
    flowing an inert gas in contact with the weir and the melt such that the weir prevents radial outward flow of the inert gas below a top of the weir and a partial pressure of a silicon monoxide gas released from the melt is increased at a radial inner maximum weir erosion point.

9. The method according to claim 8, wherein the weir includes a cap, and the inert gas is directed in a manner to flow under the cap.

10. The method according to claim 8, wherein flowing the inert gas includes flowing Argon gas.

11. The method according to claim 8, further comprising heating the crucible using at least one heater in proximity to the crucible.

12. The method according to claim 8, further comprising manipulating pressure within the chamber to evacuate the silicon monoxide gas.

13. The method according to claim 12, wherein manipulating pressure includes using a vacuum device.

14. The method according to claim 8, wherein the maximum weir erosion point is a point along the melt/crystal interface.

15. A system for growing ingots by the Czochralski method, the ingots being drawn from a melt/crystal interface in a quantity of molten silicon replenished by crystalline feedstock, the apparatus comprising:
    a growth chamber defining an enclosure configured to circulate a purge gas about the growing ingot;
    a crucible provided in the growth chamber configured to hold the molten silicon;
    a feed supply for supplying the crystalline feedstock;
    a heater for heating the crystalline feedstock and the molten silicon; and
    a weir supported in the crucible, and configured to separate the molten silicon into an inner growth region surrounding the melt/crystal interface from an outer region configured to receive the crystalline feedstock, the weir having a T-shaped cross-section and comprising at least one sidewall extending vertically and a cap extending substantially perpendicularly to the sidewall, wherein the cap and the sidewall define a modified flow region extending from the molten silicon to a top of the sidewall, wherein the sidewall prevents radial outward gas flow from the modified flow region.

16. The system according to claim 15, wherein the cap extends substantially perpendicular to the sidewall in a direction radially inward from the at least one sidewall.

17. The system according to claim 15, wherein the cap extends substantially perpendicular to the sidewall in a direction radially inward from the at least one sidewall, and substantially perpendicular to the sidewall in a direction radially outward from the at least one sidewall.

18. The system according to claim 15, further comprising a second weir mounted in the crucible and having at least one sidewall extending vertically, the second weir located radially outward from the weir.

19. The system according to claim 18, wherein the weir has a lower height than the second weir.

20. The system according to claim 15, wherein the weir includes quartz.

* * * * *